United States Patent
Zheng et al.

(10) Patent No.: US 10,541,507 B2
(45) Date of Patent: Jan. 21, 2020

(54) GENERATION DEVICE AND GENERATION METHOD OF TERAHERTZ WAVES WITH ORBITAL ANGULAR MOMENTUM

(71) Applicants: CHINA COMMUNICATION TECHNOLOGY CO., LTD., Shenzhen (CN); SHENZHEN INSTITUTE OF TERAHERTZ TECHNOLOGY AND INNOVATION, Shenzhen (CN)

(72) Inventors: Zhu Zheng, Shenzhen (CN); Qing Ding, Shenzhen (CN)

(73) Assignees: China Communication Technology Co., Ltd., Shenzhen (CN); Shenzhen Institute of Terahertz Technology and Innovation, Shenzhen (CN)

( * ) Notice: Subject to any disclaimer, the term of this patent is extended or adjusted under 35 U.S.C. 154(b) by 0 days.

(21) Appl. No.: 15/561,002

(22) PCT Filed: May 23, 2017

(86) PCT No.: PCT/CN2017/085493
§ 371 (c)(1),
(2) Date: Aug. 31, 2018

(87) PCT Pub. No.: WO2018/040625
PCT Pub. Date: Mar. 8, 2018

(65) Prior Publication Data
US 2019/0181604 A1 Jun. 13, 2019

(30) Foreign Application Priority Data
Sep. 5, 2016 (CN) .......................... 2016 1 0802896

(51) Int. Cl.
*H01S 3/10* (2006.01)
*H01S 5/00* (2006.01)
(Continued)

(52) U.S. Cl.
CPC .......... *H01S 5/0085* (2013.01); *H01S 3/0085* (2013.01); *H01S 3/067* (2013.01);
(Continued)

(58) Field of Classification Search
CPC ...... H01S 5/0085; H01S 5/0654; H01S 5/141; H01S 5/4012; H01S 3/0085; H01S 3/067; H01S 3/08031; H01S 3/1003
See application file for complete search history.

(56) References Cited

U.S. PATENT DOCUMENTS 9,103,975 B2    8/2015    Yu et al.
2011/0192978 A1*    8/2011    Jeon ...................... H01S 5/0623
                                                    250/339.06
(Continued)

FOREIGN PATENT DOCUMENTS

CN         1815828       8/2006
CN        102929071      2/2013
(Continued)

OTHER PUBLICATIONS

Sobhani et al., "Creation of twisted terahertz waves carrying orbital angular momentum via a plasma vortex", J. Phys. D: Appl. Phys., 49 (2016) 295107, pp. 1-11.
(Continued)

*Primary Examiner* — Kinam Park
(74) *Attorney, Agent, or Firm* — Jason P. Mueller; Adams and Reese, LLP

(57) ABSTRACT

The present invention relates to a generation device and a generation method of terahertz waves with orbital angular momentum. The generation device comprises a first laser and a second laser; the first laser radiates a first laser beam; the second laser radiates a second laser beam; and the frequency difference between the first laser beam and the second laser beam is within a terahertz wave band. The
(Continued)

generation device further comprises an orbital angular momentum generator, a beam combiner and a terahertz radiation generator; the first laser beam passes through the orbital angular momentum generator to generate the first laser beam with the orbital angular momentum; after the first laser beam with the orbital angular momentum and a second laser beam are combined to form a combined beam, the combined beam reaches a terahertz radiation transmitter; the terahertz radiation transmitter performs frequency mixing and filtering processing on the first laser beam A with the orbital angular momentum and the second laser beam B to generate terahertz waves with the orbital angular momentum. Through a simple beam path design, terahertz wave beams with orbital angular momentum, which are low in consumption and high in efficiency, can be obtained.

12 Claims, 1 Drawing Sheet

(51) Int. Cl.
| | | |
|---|---|---|
| *H01S 5/40* | (2006.01) | |
| *H01S 5/14* | (2006.01) | |
| *H01S 3/00* | (2006.01) | |
| *H01S 3/067* | (2006.01) | |
| *H01S 3/08* | (2006.01) | |
| *H01S 5/065* | (2006.01) | |

(52) U.S. Cl.
CPC ........ *H01S 3/08031* (2013.01); *H01S 3/1003* (2013.01); *H01S 5/0654* (2013.01); *H01S 5/141* (2013.01); *H01S 5/4012* (2013.01)

(56) References Cited

U.S. PATENT DOCUMENTS

| | | | |
|---|---|---|---|
| 2015/0123017 A1* | 5/2015 | Yu | G02B 6/12007 250/503.1 |
| 2015/0311665 A1* | 10/2015 | Belkin | H01S 5/3402 372/20 |
| 2017/0063044 A1* | 3/2017 | Dougakiuchi | H01S 5/3402 |
| 2018/0373118 A1* | 12/2018 | Kiffner | G02F 1/353 |
| 2019/0137793 A1* | 5/2019 | Luo | G02F 1/0126 |
| 2019/0164607 A1* | 5/2019 | Kaczmarek | G11C 13/04 |

FOREIGN PATENT DOCUMENTS

| | | |
|---|---|---|
| CN | 103001111 | 3/2013 |
| CN | 105158834 | 12/2015 |
| CN | 105866981 | 8/2016 |
| CN | 106159641 | 11/2016 |
| GB | 2517344 | 2/2015 |
| JP | 2015163912 | 9/2015 |
| WO | 2013/179023 | 12/2013 |
| WO | 2015/192094 | 12/2015 |

OTHER PUBLICATIONS

Miyamoto et al., "Direct observation of the topological charge of a terahertz vortex beam generated by a Tsurupica spiral phase plate", Applied Physics Letters, 104 (2014) 261104, pp. 1-4.
Wei et al., "Generating Switchable and Reconfigurable Optical Vortices via Photopatterning of Liquid Crystals", Advanced Materials, 2013, Wiley-VCH, pp. 1-6.
"The Application of Orbital Angular Momentum Technology in Wireless Communication", Telecommunications Network Technology No. 9, Aug. 18, 2013.

* cited by examiner

GENERATION DEVICE AND GENERATION METHOD OF TERAHERTZ WAVES WITH ORBITAL ANGULAR MOMENTUM

TECHNICAL FIELD

The present invention relates to the technical field of terahertz, in particular to a generation device and a generation method of terahertz waves with orbital angular momentum.

DESCRIPTION OF THE RELATED ART

Besides energy and momentum, light beams also carry angular momentum. The angular momentum of a light beam can be divided into two parts, namely a spinning angular momentum related to the polarization of the light beam and an orbital angular momentum (OAM) related to the angular distribution of the complex amplitude of an optical field. The spinning angular momentum of the light beam has been known for a long time. In the year of 1936, Beth first measured the values of the spinning angular momentum of light beams and the famous constant $\hbar$. The orbital angular momentum of the light beam was not completely disclosed until the research made by Allen performed in 1992. Allen found that each photon in a light beam with a spiral wave-front structure $\exp(il\varphi)$ carries orbital angular momentum of $l\hbar$. Since then, the orbital angular momentum of light beam has been widely applied in various fields such as wave beam plastic, focal field control, optical micro-operation, quantum applications and communication.

Few means can be used for loading the angular momentum to wave beams in the terahertz frequency band, in particular in the channel multiplex applications of the angular momentum because beams need time modulation signals and a spiral phase wave-front at the same time. The traditional method for loading an angular momentum to wave beams in the terahertz frequency band utilizes spiral phase plates or forked diffraction gratings during the loading. However, the light intensity of a wave beam is greatly consumed in the loading process, then the limited link budget in THz spectrum will become even shrinking.

SUMMARY OF THE PRESENT INVENTION

In view of the above related art, it is necessary to provide a new generation device and a new generation method of terahertz waves with orbital angular moment. The generation device has the advantages of simple structure, low power consumption and high efficiency.

According to the present invention, a generation device of terahertz waves with orbital angular momentum is provided, which includes a first laser and a second laser; the first laser radiates a first laser beam; and the second laser radiates a second laser beam; the frequency difference between the first laser beam and the second laser beam is within a terahertz wave band. The generation device further comprises an orbital angular momentum generator, a beam combiner and a terahertz radiation transmitter.

The first laser beam passes through the orbital angular momentum generator to generate the first laser beam with the orbital angular momentum; then the first laser beam with the orbital angular momentum and the second laser beam are combined to form a combined beam, and the combined beam reaches the terahertz radiation transmitter.

The terahertz radiation transmitter performs frequency difference processing on the first laser beam with the orbital angular momentum and the second laser beam, and then terahertz waves with the orbital angular momentum are obtained.

According to one embodiment of the present invention, the generation device further includes a first lens; and the first laser beam with orbital angular momentum and the second laser beam are focused on the terahertz radiation generator through the first lens.

According to another embodiment of the present invention, the terahertz radiation transmitter includes a lining layer and a photo-conductive layer which are laminated in turn and a metal electrode disposed on the photo-conductive layer.

According to another embodiment of the present invention, the terahertz radiation transmitter further includes a second lens; the second lens is used for collimating the divergent terahertz waves with orbital angular momentum such that the terahertz waves with orbital angular momentum exit in parallel.

According to another embodiment of the present invention, the orbital angular momentum generator is a spiral phase step plate; the first laser beam enters along the direction vertical to the surface normal of the spiral phase step plate, and an emergent beam obtains an angular momentum component along the transmission direction of the first laser beam.

According to another embodiment of the present invention, the orbital angular momentum generator is a forked grating; the first laser beam enters along the direction vertical to the surface normal of the forked grating, and a first-order diffraction beam generated by the forked-grating has a spiral phase.

Besides, the present invention further provides a generation method of terahertz wave beams with orbital angular momentum, including the following steps of:

acquiring a first laser beam and a second laser beam of which the frequency difference is within the terahertz band;

loading orbital angular momentum information into the transmission path of the first laser beam to form the first laser beam with the orbital angular momentum;

combining the first laser beam with the orbital angular momentum and the second laser beam to form a combined beam, and radiating the combined beam into the terahertz radiation transmitter to form terahertz waves with orbital angular momentum.

According to one embodiment of the present invention, the step of combining the first laser beam with the orbital angular momentum and the second laser beam to form a combined beam, and radiating the combined beam into the terahertz radiation transmitter to form terahertz waves with orbital angular momentum further includes the following steps of:

superimposing optical fields (electric amplitude) of the first laser beam with the orbital angular momentum and the second laser beam;

calculating the synthetic optical vector (electric field amplitude) of the superimposed first laser beam with the orbital angular momentum and second laser beam;

calculating the optical field intensity (electric field intensity) of the superimposed first laser beam with the orbital angular momentum and second laser beam, wherein the optical field intensity (electric field intensity) is directly related to the square of the synthetic optical vector (electric field amplitude).

According to one embodiment of the present invention, the optical fields (electric amplitude) of the first laser beam with the orbital angular momentum and second laser beam are equal in initial amplitude.

According to one embodiment of the present invention, frequency difference processing is carried out on the synthetic optical vector while calculating the optical field intensity (electric field intensity).

The generation device of terahertz waves with orbital angular momentum includes a first laser and a second laser; the first laser radiates a first laser beam; the second laser radiates a second laser beam; and the frequency difference between the first laser beam and the second laser beam is within a terahertz wave band. The generation device further includes an orbital angular momentum generator, a beam combiner and a terahertz radiation transmitter; the first laser beam passes through the orbital angular momentum generator to generate the first laser beam with the orbital angular momentum; after the first laser beam with the orbital angular momentum and the second laser beam are combined to form a combined beam, the combined beam reaches a terahertz radiation transmitter; the terahertz radiation transmitter performs frequency mixing and filtering processing on the first laser beam with the orbital angular momentum and the second laser beam to generate terahertz waves with the orbital angular momentum. Through a simple beam path design, terahertz wave beams with orbital angular momentum, which are low in consumption and high in efficiency, can be obtained.

BRIEF DESCRIPTION OF THE ATTACHED DRAWINGS

Figure 1:
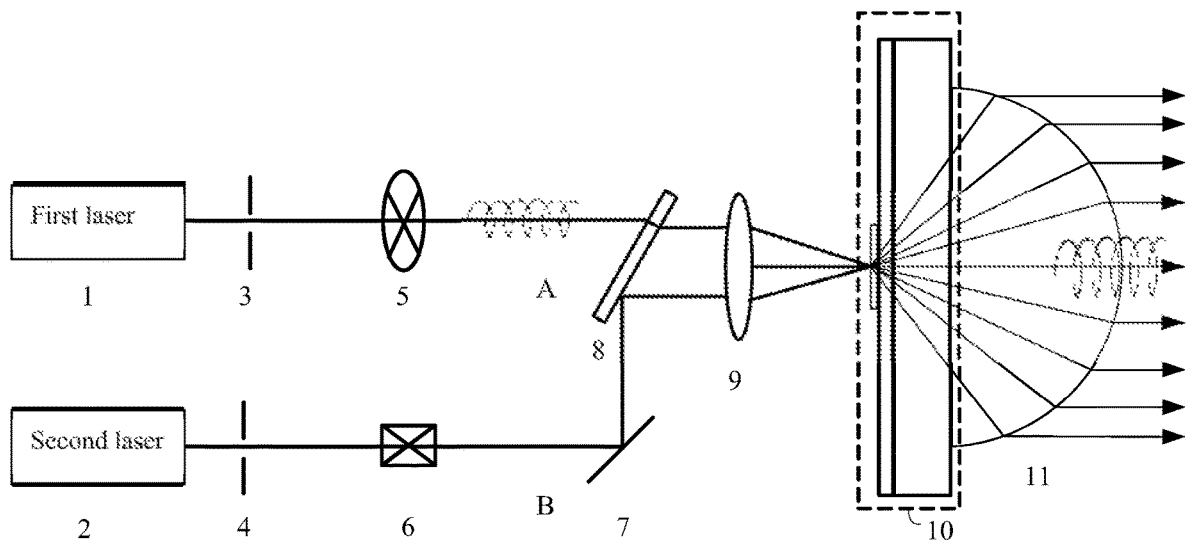
FIG. 1 is an optical path diagram of a generation device of terahertz wave with orbital angular momentum.
Figure 2:
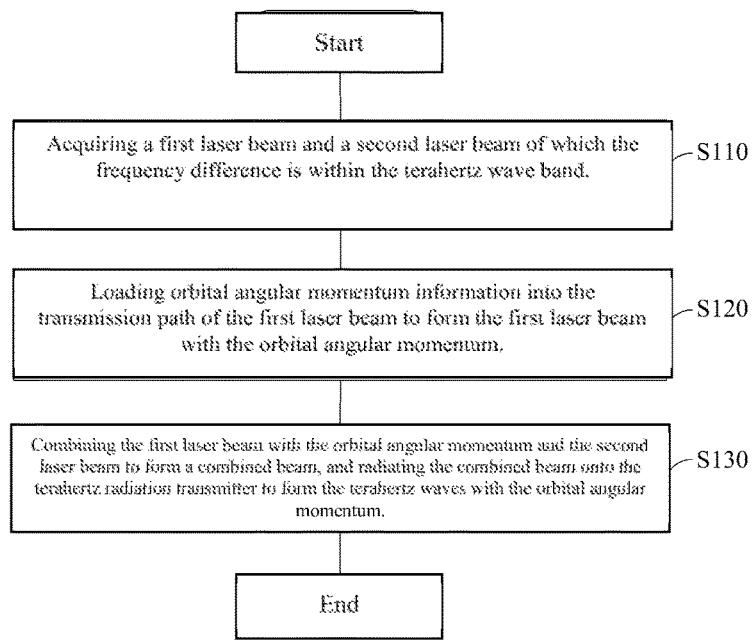
FIG. 2 is a flow chart of a generation method of terahertz wave with orbital angular momentum.

Numerals in the drawings: first laser 1; second laser 2; first diaphragm 3; second diaphragm 4; orbital angular momentum generator 5; acoustic-optical modulator 6; silver reflector 7; beam combiner 8; first lens 9; terahertz radiation transmtter 10; second lens 11.

DESCRIPTION OF PREFERRED EMBODIMENTS

For better understanding of the present invention, the present invention is comprehensively described below with reference to the attached drawings. Preferred embodiments are shown in the attached drawings. However, the present invention can be implemented in various ways, and is not limited to the embodiments described in the present invention. On the contrary, the purpose of providing the embodiments is to ensure that the contents disclosed in the present invention can be understood more thoroughly and comprehensively.

Unless otherwise defined, all technical and scientific terms used in the text have meanings generally understood by those skilled in the technical field of the present invention. The terms in the text of the description of the present invention are used only for the purpose of describing the specific embodiments of the present invention, instead of limiting the present invention. The term "and/or" in the text includes one or any and all combinations of various relevant items listed.

FIG. 1 is an optical path diagram of a generation device of terahertz waves with orbital angular momentum. The generation device includes a first laser 1 and a second laser 2. The first laser 1 radiates a first laser beam A; the second laser 2 radiates a second laser beam B; and the frequency difference between the first laser beam A and the second laser beam B is within a terahertz wave band. The generation device further includes an orbital angular momentum generator 5, a beam combiner 8 and a terahertz radiation transmitter 10. A first laser beam passes through the orbital angular momentum generator 5 to generate the first laser beam A with the orbital angular momentum. After the first laser beam A with the orbital angular momentum and the second laser beam B are combined by the beam combiner 8 to form a combined beam, the combined beam reaches the terahertz radiation transmitter 10; the terahertz radiation transmitter 10 performs frequency difference processing on the first laser beam A with the orbital angular momentum and the second laser beam B, and then the terahertz waves with the orbital angular momentum are obtained.

In another embodiment, a similar orbital angular momentum generator can also be loaded in the transmission path of the second laser beam B. After the first laser beam A with the orbital angular momentum and the second laser beam B with the orbital angular momentum are combined by the beam combiner to form a combined beam, the combined beam reaches the terahertz radiation transmitter; the terahertz radiation transmitter performs frequency difference processing on the first laser beam with the orbital angular momentum and the second laser beam with orbital angular momentum, and then the terahertz waves with the orbital angular momentum are obtained.

In this embodiment, the first laser 1 and the second laser 2 are both semiconductor lasers. In other embodiments, the first laser and the second laser can also be other single-longitudinal-mode, narrow-line-width continuous lasers, for example fiber lasers. The types of the first laser 1 and the second laser 2 can be determined upon actual demands. Wherein, the first laser beam A and the second laser beam B are two interfering laser beams which are identical in frequency and vibration direction and keep a constant phase difference. In the optical path, a first diaphragm 3 and a second diaphragm 4 for collimating laser beams and a silver reflector 7 for turning corresponding beam paths are also provided, so that the transmission directions of the first laser beam A and the second laser beam B are parallel; and an acoustic optical modulator 6 for modulating signals of the loading time of the second laser beam is also included.

In this embodiment, the orbital angular momentum generator 5 is a spiral phase step plate. According to the discovery of Allen that each o photon in a light beam with a spiral wave-front structure $\exp(il\varphi)$ carries the orbital angular momentum of $l\hbar$, emergent optical waves carry the orbital angular momentum as long as the emergent optical waves have a spiral phase. The first laser beam A enters along the direction vertical to the surface normal of the spiral phase step plate, and on the other side of the spiral phase step plate, the first laser beam A exits along the normal on the other side of the spiral phase step plate. Therefore, the emergent beam obtains a linear momentum component along the azimuth angle of the emergent surface, which means that the emergent beam has an angular momentum along the transmission direction of the first laser beam A. The spiral phase step plate needs very high spiral surface inclination accuracy. By immersing a spiral phase step plate with a larger physical order into a system-matched liquid bath, the desirable thickness of the step plate is accurately adjusted and obtained by controlling the temperature of the liquid bath.

In another embodiment, the orbital angular momentum generator 5 is a forked grating. The first laser beam A enters along the direction vertical to the surface normal of the forked grating, and a first-order diffraction beam generated by the forked-grating has a spiral phase. In other embodiments, the orbital angular momentum generator 5 can also be a spiral Fresnel lens or other mode converters which can convert the Hermit-Gauss beam into the Laguerre-Gaussian beam.

The generation device can further includes a first lens 9; and the first laser beam A with the orbital angular momentum and the second laser beam B are focused on the terahertz radiation transmitter through the first lens 9.

In this embodiment, the terahertz radiation transmitter 10 includes a lining layer and a photo-conductive layer which are laminated in turn and a metal electrode disposed on the photo-conductive layer. Wherein, the lining layer has a carrier life which is as short as possible, a high carrier migration rate and high medium breakdown-resistant intensity. In this embodiment, the lining layer is gallium arsenide (LT-GaAs) which grows at a low temperature, and has a relatively high carrier migration rate and very strong breakdown-resistant intensity. In other embodiments, the lining layer can also be indium arsenide (InAs) or doped silicon (Si). In this embodiment, the metal electrode is shaped as a fork and has a radiation area which is big enough, capable of covering the laser beam with a spiral phase. In other embodiments, the metal electrode can be a conical antenna, transmission line or large-aperture photo-conductive antenna. The first laser beam A with the orbital angular momentum and the second laser beam B are focused on the terahertz radiation generator through the first lens 9. When a laser pulse reaches the lining layer between two electrodes and when the energy of the photons of the incident light is greater than the energy gap width of a substrate material, photo-generated carriers are generated on the radiated substrate between two electrodes.

According to the law of conservation of angular momentum, in the frequency mixing and filtering process, the photon-generated carriers are transmitted in the lining layer in the terahertz radiation transmitter 10, and the lining layer can be deemed as an isotropic medium which does not affect the angular momentum. In other words, the terahertz waves with orbital angular momentum can be radiated out.

The terahertz radiation transmitter 10 includes a second lens 11. The second lens 11 is used for collimating scattered terahertz waves with orbital angular momentum such that terahertz waves with orbital angular momentum exit in parallel.

Through the aforementioned simple beam path design, the terahertz wave beams with orbital angular momentum, which are low in consumption and high in efficiency, can be obtained.

As mentioned, the present invention further provides a generation method of terahertz wave beams with orbital angular momentum which includes the following steps.

Step S110: Acquiring a first laser beam and a second laser beam of which the frequency difference is within the terahertz wave band.

The first laser 1 radiates the first laser beam A, and the second laser 2 radiates the second laser beam B, wherein the frequency difference between the first laser beam A and the second laser beam B is within the terahertz wave band. The first laser 1 and the second laser 2 are both semiconductor lasers, both radiating single-longitudinal-mode, narrow-line-width continuous laser waves. In the optical path, a first diaphragm 3 and a second diaphragm 4 for collimating laser beams and a silver reflector 7 for turning corresponding beam paths are also provided, so that the transmission directions of the first laser beam A and the second laser beam B are parallel; and an acoustic optical modulator 6 for modulating signals of the loading time of the second laser beam is also included.

Step S120: Loading orbital angular momentum information into the transmission path of the first laser beam to form a first laser beam with orbital angular momentum.

In this embodiment, a spiral phase step plate is disposed in the transmission path of the first laser beam A. The first laser beam A enters along the direction vertical to the surface normal of the spiral phase step plate, and on the other side of the spiral phase step plate, the first laser beam A exits along the normal on the other side of the spiral phase step plate. Therefore, the emergent beam obtains a linear momentum component along the azimuth angle of the emergent surface, which means that the emergent beam carries the orbital angular momentum. In other embodiments, the forked grating, the spiral Fresnel lens or other mode converters which can convert a Hermit-Gauss beam into a Laguerre-Gaussian beam can also be disposed in the transmission path of the first laser beam A, thus forming the first laser beam A with the orbital angular momentum.

In this embodiment, the optical field of the first laser beam A with the orbital angular momentum is recorded as $E_+(t)$, $E_+(t)=\cos(w_+t+\varphi_+)$. Wherein, $E_+$, $\omega_+$, $\varphi_+$ respectively are the initial amplitude, frequency and spiral phase of the first laser beam A with the orbital angular momentum, wherein, $\varphi_+=\varphi_{spiral}$. The optical field of the second laser beam B is recorded as $E_-(t)$, $E_-(t)=\cos(w_-t+\varphi_-)$, and $E_-$, $\omega_-$, $\varphi_-$ respectively are the initial amplitude, frequency and spiral phase of the second laser beam B.

In other embodiments, an orbital angular momentum information can be loaded into the transmission optical path of the second laser beam at the same time to form the second laser beam with the orbital angular momentum.

Step S130: after combining the first laser beam with the orbital angular momentum and the second laser beam to form a combined beam, radiating the combined beam into the terahertz radiation transmitter to form the terahertz waves with the orbital angular momentum.

According to the law of conservation of angular momentum, in the frequency mixing and filtering process, the photon-generated carriers are transmitted in the lining layer in the terahertz radiation transmitter, and the lining layer can be deemed as an isotropic medium which does not affect the angular momentum.

$$L_{Opt1}+L_{Opt2}-L_{THz}=0$$

Wherein, $L_{Opt1}$ represents the angular momentum of the first laser beam A with the orbital angular momentum; $L_{Opt2}$ represents the angular momentum of the second laser beam B; and $L_{THz}$ represents the angular momentum of the terahertz waves with the orbital angular momentum.

The first laser beam A with the orbital angular momentum and the second laser beam B are focused on the terahertz radiation transmitter, and the optical fields (electric amplitude) of the first laser beam A with the orbital angular momentum and the second laser beam B are superimposed.

The synthetic optical vector (electric field amplitude) of the superimposed first laser beam A with the orbital angular momentum and second laser beam B w is calculated, and recorded as E(t). The synthetic optical vector (electric field amplitude) can be expressed as:

$$E(t)=E_+\cdot\cos(\omega_+t+\varphi_-)+E_-\cdot\cos(\omega_-t+\varphi_-)$$

The optical field intensity (electric field intensity) of the superimposed first laser beam A with the orbital angular momentum and second laser beam B is calculated, wherein the optical field intensity (electric field intensity) is directly related to the square of the optical vector (electric field amplitude).

The superimposed first laser beam A with the orbital angular momentum and second laser beam B are guided into the terahertz radiation transmitter, wherein the optical field intensity (electric field intensity) I of the radiation of the terahertz radiation transmitter is just related to the square $|E(t)|^2$ of the synthetic optical vector (electric field amplitude).

$$I \propto |E(t)|^2$$

In the terahertz radiation transmitter, the first laser beam A with the orbital angular momentum and the second laser beam B are equal in initial amplitude, namely $E_+ = E_- = E_0$.

Optical field intensity (electric field intensity) of the radiation of the terahertz radiation transmitter:

$$I \propto |E(t)|^2 = E_0^2 \cdot [\cos(\omega_+ t + \varphi_-) + \cos(\omega_- t + \varphi_-)]^2$$

$$= E_0^2 \cdot \begin{bmatrix} \cos^2(\omega_+ t + \varphi_+) + \cos^2(\omega_- t + \varphi_-) + \\ 2\cos(\omega_+ t + \varphi_+)\cos(\omega_- t + \varphi_-) \end{bmatrix}$$

$$= E_0^2 \cdot \begin{bmatrix} 1 + \frac{1}{2}\cos(2\omega_+ t + 2\varphi_+) + \frac{1}{2}\cos(2\omega_- t + 2\varphi_-) + \\ \cos((\omega_+ + \omega_-)t + (\varphi_+ + \varphi_-)) + \\ \cos((\omega_+ - \omega_-)t + (\varphi_+ - \varphi_-)) \end{bmatrix}$$

During calculation of the optical field intensity (electric field intensity), frequency difference processing is carried out on the synthetic optical vector (electric field amplitude). Due to the limit in the electronic response rate of semiconductor photoelectric devices, the response speed of the photon-generated carriers is lower than the vibrating speed of a frequency item, namely being only modulated by direct current items and frequency difference items, so the light intensity of the semiconductor photon-generated carriers are effectively modulated:

$$I_{modulation} = E_0^2 \cdot [1 + \cos((\omega_+ - w_-)t + (\varphi_+ - \varphi_-))]$$

wherein, the difference between $\omega_+$ and $\omega_-$ is a terahertz wave frequency, namely $\omega_{THz} = \omega_+ - \omega_-$.
Meanwhile, $\Delta\varphi = \varphi_+ - \varphi_-$, $$I_{modulation} = E_0^2 \cdot [1 + \cos(\omega_{THz} t + \Delta\varphi)]$$

To maintain the universality, it can be set that $\varphi_- = 0$, and then:

$$I_{modulation} = E_0^2 \cdot [1 + \cos(\omega_{THz} t + \varphi_{spiral})]$$

In other embodiments, if the second laser beam is also loaded with an orbital angular momentum, then it can be set that $\varphi_- = \varphi_{spiral2}$.

$$I_{modulation} = E_0^2 \cdot [1 + \cos(\omega_{THz} t + \varphi_{spiral} - \varphi_{spiral2})]$$

By using the above device and method, the first laser beam A with the orbital angular momentum and the second laser beam B can retain the spiral phase (carrying the orbital angular momentum information) after being superimposed and passing through the terahertz radiation transmitter, which means that the optical orbital angular momentum can be equivalently transmitted with the terahertz wave beam. By using the above device and method, and by designing a simple beam path, the terahertz wave beams with orbital angular momentum, which are low in consumption and high in efficiency, can be obtained.

The various technical features in the above embodiments can be selected and combined according to designer's desires. To simplify the description, all possible selections and combinations of all technical features in the above embodiments are not described one by one. However, the selections and combinations of the technical features should fall within the scope of the description as long as the selections and combinations have no contradictions.

The above embodiments only express some of the embodiments of the present invention and are described in relative details, but cannot be accordingly regarded as limit to the patented scope of the present invention. It should be noted that, for those having ordinary skills in the art, various modifications and improvements can be made on the basis of the concept of the present invention, which all fall within the protective scope of the present invention. Therefore, the protective scope of the present invention should be subject to the attached claims.

The invention claimed is:

1. A device to generate terahertz waves having orbital angular momentum, comprising:
   a first laser and a second laser, the first laser radiating a first laser beam, the second laser radiating a second laser beam, wherein a frequency difference between a first frequency of the first laser beam and a second frequency of the second laser beam is within a terahertz band;
   an orbital angular momentum generator;
   a beam combiner; and
   a terahertz radiation transmitter;
   wherein the first laser beam passes through the orbital angular momentum generator to generate a third laser beam having an orbital angular momentum;
   wherein the beam combiner combines the third laser beam and the second laser beam to form a combined beam, and wherein the combined beam reaches the terahertz radiation transmitter after the combination of the third laser beam and the second laser beam;
   wherein the terahertz radiation transmitter performs frequency difference processing on the third laser beam and the second laser beam, resulting in the terahertz waves having the orbital angular momentum.

2. The device of claim 1, further comprising a first lens, wherein the third laser beam and the second laser beam are focused on the terahertz radiation transmitter through the first lens.

3. The device of claim 1, wherein the terahertz radiation transmitter comprises a lining layer and a photo-conductive layer that are laminated in turn, and a metal electrode disposed on the photo-conductive layer.

4. The device of claim 3, wherein the terahertz radiation transmitter comprises a second lens to collimate scattered terahertz waves having the orbital angular momentum such that the terahertz waves with orbital angular momentum exit in parallel.

5. The device of claim 1, wherein the orbital angular momentum generator comprises a spiral phase step plate, the first laser beam enters along a direction perpendicular to a surface normal to the spiral phase step plate, and an emergent beam obtains a linear momentum component along the transmission direction of the first laser beam.

6. The device of claim 1, wherein the orbital angular momentum generator is a forked grating, the first laser beam enters along a direction perpendicular to a surface normal to the forked grating, and a first-order diffraction beam generated by the forked grating has a spiral phase.

7. A method of generating terahertz waves having orbital angular momentum, comprising:
   acquiring a first laser beam having a first frequency;

acquiring a second laser beam having a second frequency, a frequency difference between the first frequency and the second frequency is within a terahertz band;

loading orbital angular momentum information into the transmission path of the first laser beam to form a third laser beam having an orbital angular momentum;

combining the third laser beam and the second laser beam to form a combined beam; and radiating the combined beam onto a terahertz radiation transmitter to form the terahertz waves having the orbital angular momentum.

8. The method of claim 7, wherein combining the third laser beam and the second laser beam and radiating the combined beam onto the terahertz radiation transmitter to form the terahertz waves having the orbital angular momentum comprises:

superimposing optical fields of the third laser beam and the second laser beam;

determining a synthetic optical vector of the superimposed optical fields of the third laser beam and the second laser beam;

determining an optical field intensity of the superimposed optical fields of the third laser beam and the second laser beam, wherein the optical field intensity is directly proportional to the square of the synthetic optical vector.

9. The method of claim 8, wherein the respective optical fields of the third laser beam and the second laser beam have a same initial amplitude.

10. The method of claim 8, wherein frequency difference processing is carried out on the synthetic optical vector while determining the optical field intensity.

11. The method of claim 8, wherein an orbital angular momentum information is loaded into a transmission path of the second laser beam to form a fourth laser beam having a second orbital angular momentum.

12. The device of claim 1, wherein the second laser beam passes through the orbital angular momentum generator to generate a fourth laser beam having a second orbital angular momentum.

* * * * *